United States Patent
Yoo et al.

(10) Patent No.: US 11,489,135 B2
(45) Date of Patent: Nov. 1, 2022

(54) ELECTROLUMINESCENCE DISPLAY HAVING ULTRA HIGH RESOLUTION

(71) Applicant: LG Display Co., Ltd., Seoul (KR)

(72) Inventors: JuhnSuk Yoo, Paju-si (KR); HoYoung Lee, Paju-si (KR); Neunghee Lee, Paju-si (KR); Kyuri Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/399,119

(22) Filed: Apr. 30, 2019

(65) Prior Publication Data

US 2020/0035941 A1    Jan. 30, 2020

(30) Foreign Application Priority Data

Jul. 30, 2018  (KR) .................. 10-2018-0088502

(51) Int. Cl.
*H01L 51/52* (2006.01)
*H01L 27/32* (2006.01)
*H01L 51/50* (2006.01)

(52) U.S. Cl.
CPC ...... *H01L 51/5212* (2013.01); *H01L 27/3244* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5209* (2013.01); *H01L 51/5225* (2013.01)

(58) Field of Classification Search
CPC ............. H01L 51/5212; H01L 51/5012; H01L 51/5056; H01L 51/5072; H01L 51/5088; H01L 51/5092; H01L 51/5209; H01L 51/5225; H01L 51/5203; H01L 51/5048; H01L 27/3244; H01L 27/3272; H01L 27/3246; H01L 27/3276; H01L 27/3262; H01L 27/3216; H01L 27/3218; H01L 27/322; H01L 27/3279; H01L 27/3213

See application file for complete search history.

(56) References Cited

U.S. PATENT DOCUMENTS 8,188,948 B2    5/2012    Choi et al.
8,305,311 B2    11/2012    Choi et al.
(Continued)

FOREIGN PATENT DOCUMENTS

EP          3343627 A1      7/2018
KR   10-2009-0047994 A     5/2009
(Continued)

OTHER PUBLICATIONS

Korean Intellectual Property Administration, Office Action, KR Patent Application No. 10-2018-0088502, dated Sep. 13, 2022, 13 pages.

*Primary Examiner* — Nilufa Rahim
(74) *Attorney, Agent, or Firm* — Fenwick & West LLP

(57) ABSTRACT

Disclosed is an electroluminescence display having a structure in which the current leakage between neighboring pixels is prevented. The electroluminescence display comprises a first pixel defined for representing a first color on a substrate, a second pixel defined for representing a second color on the substrate, a first anode electrode disposed at the first pixel, a second anode electrode disposed at the second pixel, and a depletion electrode forming a depletion area between the first anode electrode and the second anode electrode.

20 Claims, 7 Drawing Sheets

(56) References Cited

U.S. PATENT DOCUMENTS

| | | | |
|---|---|---|---|
| 8,969,855 B2 | 3/2015 | Kwak | |
| 2009/0121982 A1 | 5/2009 | Choi et al. | |
| 2012/0217517 A1 | 8/2012 | Choi et al. | |
| 2013/0140589 A1 | 6/2013 | Kwak | |
| 2014/0042400 A1 | 2/2014 | Kim et al. | |
| 2016/0118449 A1 | 4/2016 | Sato et al. | |
| 2017/0338438 A1* | 11/2017 | Kwon | H01L 51/5221 |
| 2018/0033851 A1* | 2/2018 | Kim | H01L 27/3279 |
| 2018/0102499 A1* | 4/2018 | Pyo | H01L 51/5228 |
| 2019/0189954 A1* | 6/2019 | Naganuma | H01L 51/5281 |
| 2020/0005709 A1* | 1/2020 | Kim | H01L 27/3218 |

FOREIGN PATENT DOCUMENTS

| | | |
|---|---|---|
| KR | 10-2013-0061493 A | 6/2013 |
| KR | 10-2014-0143861 A | 12/2014 |
| KR | 10-2015-0061920 A | 6/2015 |
| KR | 10-2016-0032405 A | 3/2016 |
| KR | 10-2016-0072010 A | 6/2016 |

\* cited by examiner

ELECTROLUMINESCENCE DISPLAY HAVING ULTRA HIGH RESOLUTION

CROSS-REFERENCE TO RELATED APPLICATIONS

This application claims the benefit of Republic of Korea Patent Application No. 10-2018-0088502 filed on Jul. 30, 2018, which is hereby incorporated by reference in its entirety.

BACKGROUND

Field

The present disclosure relates to an electroluminescence display having a structure in which current leakage between neighboring pixels is prevented. In detail, the present disclosure relates to an electroluminescence display having superior color gamut (or color reproduction range) by blocking the current leakage, to solve the deterioration of color quality due to the current leakage between neighboring pixels as the distance between the neighboring pixels is closer as the pixel density is increased.

Discussion of the Related Art

With the advancement of information-oriented society, various requirements for display devices for displaying an image are increasing. Various display devices such as the liquid crystal display (or LCD) devices, the electroluminescence display devices and the quantum dot display (or QD) are being practically used.

The electroluminescence display, as a self-luminescence device, has characteristics of superior viewing angle and contrast ratio, of light weight and thin thickness without back light unit, and of low electric power consumption. In detail, the organic light emitting display among the electroluminescence display has merits where the driving is performed with a direct current and low voltage, a fast response time, and manufacturing cost is lower than other types of displays.

The electroluminescence display includes a plurality of the light emitting diodes. The light emitting diode includes an anode electrode, a light emitting layer formed on the anode electrode, and a cathode electrode on the light emitting layer. As the high level voltage is applied to the anode electrode and the low level voltage is applied to the cathode electrode, the hole and the electron are moved to the light emitting layer from the anode electrode and the cathode electrode, respectively. The light emitting layer emits light as excitons are generated by the combination of electrons and holes and dropped from an exited state to a ground state. By controlling the amount of light generated at each of the light emitting layers of the light emitting diodes, the electroluminescence display represents the video data.

In order to provide the high quality video images, the resolution of the display is getting higher and higher. For example, for the portable personal information device under 10 inch diagonal line of the display panel, it is required that the resolution would be enhanced to be over 300PPI (Pixel Per Inch) up to 500PPI. However, there are many problems for getting the ultra-high density resolution in the electroluminescence display. As the resolution is higher and higher, the distance between two neighboring light emitting diodes are getting closer so that the light for reproducing the video image may be distorted or deteriorated by the laterally leaked current from the neighboring light emitting diodes.

To solve this problem, many methods or suggestions are provided. For the ultra-high density electroluminescence display, solutions are required for preventing the lateral leakage current between neighboring light emitting diodes.

SUMMARY

Accordingly, the present disclosure is directed to provide an electroluminescence display that substantially obviates one or more problems due to limitations and disadvantages of the related art. For example, the present disclosure provides an electroluminescence display in which lateral leakage current between neighboring pixels is blocked and the driving power consumption is lowered, by increasing the concentration of the p-type impurity.

An aspect of the present disclosure is directed to provide an electroluminescence display comprising a first pixel defined for representing a first color on a substrate, a second pixel defined for representing a second color on the substrate, a first anode electrode at the first pixel, a second anode electrode at the second pixel, and a depletion electrode forming a depletion area between the first anode electrode and the second anode electrode. The depletion electrode is apart from the first anode electrode and the second anode electrode with a predetermined distance.

In one embodiment, the depletion electrode may have a width in a range of 30% to 60% of a gap between the first anode electrode and the second anode electrode.

In one embodiment, the depletion electrode may have a closed curve shape surrounding at least one of the first anode electrode and the second anode electrode.

In one embodiment, a width of the depletion electrode may have at least two different widths.

In one embodiment, the depletion electrode may have a maximum width at a minimum area where a distance between the first anode electrode and the second anode electrode has a minimum value, and the depletion electrode may have a minimum width at other areas excepting the minimum area.

In one embodiment, the substrate may include a display area having the first pixel and the second pixel and a non-display area surrounding the display area. The depletion electrode may be connected to a line disposed at the non-display area for supplying a high level voltage.

In one embodiment, the depletion electrode may receive a voltage equal to or higher than a voltage of the first anode electrode and a voltage of the second anode electrode.

In one embodiment, the electroluminescence display may further comprise a hole functional layer on the first anode electrode and the second anode electrode, an emission layer on the hole functional layer, an electron functional layer on the emission layer, and a cathode electrode on the electron functional layer.

In one embodiment, the hole functional layer and the electron functional layer may be commonly on the display area including the first pixel and the second pixel.

In one embodiment, the cathode electrode may be connected to a low level voltage line supplied with a low level voltage. The depletion electrode may be connected to a driving current line supplied with a high level voltage. The first anode electrode and the second anode electrode may be supplied with one voltage value in a range of the high level voltage and the low level voltage.

In one embodiment, the emission layer may include a first emission layer overlapping with the first anode electrode, and a second emission layer overlapping with the second anode electrode.

In one embodiment, the hole functional layer may include a p-type impurity of 1.0% concentration at least.

In one embodiment, the hole functional layer may include a hole injection layer on the first anode electrode and the second anode electrode, and a hole transport layer on the hole injection layer.

In one embodiment, the electron functional layer may include an electron transport layer on the emission layer, and an electron injection layer on the electron transport layer.

In one embodiment, the electroluminescence display may further comprise a third pixel defined for representing a third color light, close to at least one of the first pixel and the second pixel, and a third anode electrode at the third pixel. The depletion electrode may form the depletion areas between the first anode electrode and the third anode electrode, and between the second anode electrode and the third anode electrode.

In one embodiment, the first color, the second color and the third color may be different from each other.

In one embodiment, a first width of the depletion electrode at a minimum area where a distance between the first anode electrode and the second anode electrode has a minimum value may be larger than a second width of the depletion electrode at other areas excepting the minimum area.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings. According to the present disclosure, by adopting the depletion electrode for blocking the lateral leakage current between two neighboring subpixels, the best gamma quality can be ensured with the ultra-high density pixel resolution. Even though the concentration of the p-type impurities is increased, the lateral leakage current between two neighboring anode electrodes can be effectively blocked due to the depletion electrode. Therefore, the power consumption for driving the light emitting diode may be reduced.

To achieve these and other advantages and in accordance with the purpose of the disclosure, as embodied and broadly described herein, there is provided an electroluminescence display including a depletion electrode between the anode electrodes. The depletion electrode is made of the same material as the anode electrode, so that there is no additional process step for forming the depletion electrode. Therefore, the manufacturing process is simple. The structure of the display can provide the superior video quality. By applying high level voltage to the depletion electrode used for driving the light emitting diode, the circuit for blocking the leakage current can be simply configured.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
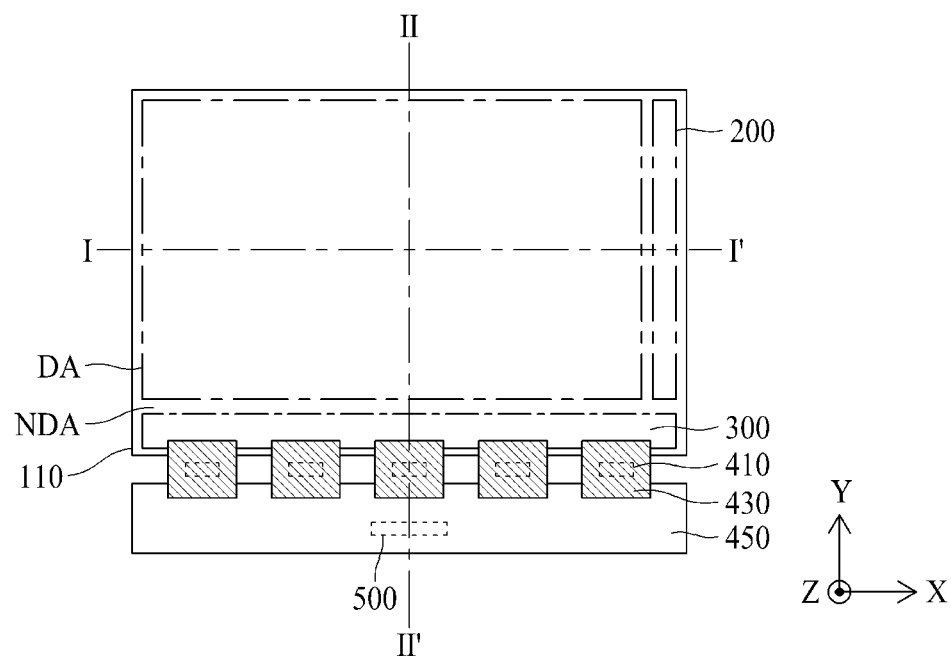
FIG. 1 is a diagram showing a structure of an electroluminescence display according an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal (or X) axis direction," "second horizontal (or Y) axis direction," and "vertical (or Z) axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, exemplary embodiments of the present disclosure will be described in detail with reference to the accompanying drawings. FIG. 1 is a diagram showing a structure of an electroluminescence display according an embodiment of the present disclosure. In FIG. 1, the X axis is parallel with the direction of the scan line. The Y axis is parallel with the direction of the data line. The Z axis is the height (or thickness) direction of the display.

Referring to FIG. 1, an electroluminescence display comprises a base substrate 110, a gate (or scan) driver 200, a data pad portion 300, a source driving integrated circuit (or IC) 410, a flexible film 430, a circuit board 450, and a timing controller 500.

The base substrate 110 may include an insulating material or a flexible material. For example, the base substrate 110 may be made of a glass, a metal or a plastic material, but it is not limited these materials. When the electroluminescence display is applied for a flexible display device, the base substrate 110 may be made of the flexible material such as a soft plastic material. For example, the base substrate 110 may include a transparent polyimide material.

The base substrate 110 may be divided into a display area DA and a non-display area NDA. The display area DA, as an area for representing a video image, may be defined at central areas of the base substrate 110 occupying most areas, but it is not limited thereto. The display area DA includes a plurality of scan lines (or gate lines), a plurality of data lines and a plurality of pixels. Each of the pixels may include a plurality of subpixels. Each of the subpixels may include one scan line and one data line.

The non-display area NDA, as an area not representing the video image, may be defined at the circumference area of the base substrate 110 as surrounding whole sides or some sides of the display area DA. The non-display area NDA may include a gate driver 200 and a data pad portion 300.

The gate driver 200 supplies the scan (or gate) signals to the scan lines sequentially according to the gate control signal received from the timing controller 500. The gate driver 200 may be formed as a GIP (Gate drive In Panel) type at the non-display area NDA surrounding one side of the display area DA on the base substrate 110. The GIP type means a structure in which the gate driver 200 is directly formed on the base substrate 110.

The data pad portion 300 supplies the data signals to the data lines according to the data control signal received from the timing controller 500. The data pad portion 300 may be manufactured as the driving chip set, mounted on the flexible film 430 and attached by a TAB (Tape Automated Bonding) method at one outer side of the non-display area NDA of the base substrate 110.

The source driving integrated circuit 410 may receive the digital video data and the source control signal from the timing controller 500. The source driving integrated circuit 410 converts the digital video data into the analog data voltages according to the source control signal and sends them to the data lines. When the source driving integrated circuit 410 is made in a chip set, it may be mounted on the flexible film 430 using the COF (Chip On Film) or COP (Chip On Plastic) method.

The flexible film 430 may include a plurality of lines connecting the data pad portion 300 to the source driving integrated circuit 410, and connecting the data pad portion 300 to the circuit board 450. The flexible film 430 may be attached on the data pad portion 300 using an anisotropic conducting film (or ACF), so that the data pad portion 300 may be connected to the lines of the flexible film 430.

The flexible films 430 may be attached to the circuit board 450. The circuit board 450 may include a plurality of the driving chip set for the driving circuits. For example, the circuit board 450 may include the timing controller 500. The circuit board 450 may be a printed circuit board or a flexible printed circuit board.

The timing controller 500 receives the digital video data and the timing signals from the external system board via the cable of the circuit board 450. Based on the timing signal, the timing controller 500 generates the gate control signal for controlling the operation timing of the gate driver 200 and the source control signal for controlling the source driving integrated circuit 410. The timing controller 500 supplies the gate control signal to the gate driver 200 and supplies the source control signal to the source driving integrated circuit 410. Dependent on the products, the timing controller 500 may be formed as one driving chip embedding the source driving integrated circuit 410 and mounted on the base substrate 110.

Figure 2:
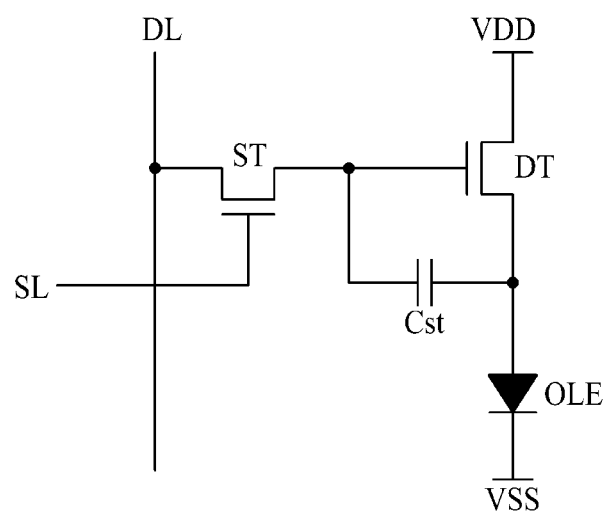
FIG. 2 is a circuit diagram illustrating a structure of one subpixel according to an embodiment of the present disclosure.
Figure 3:
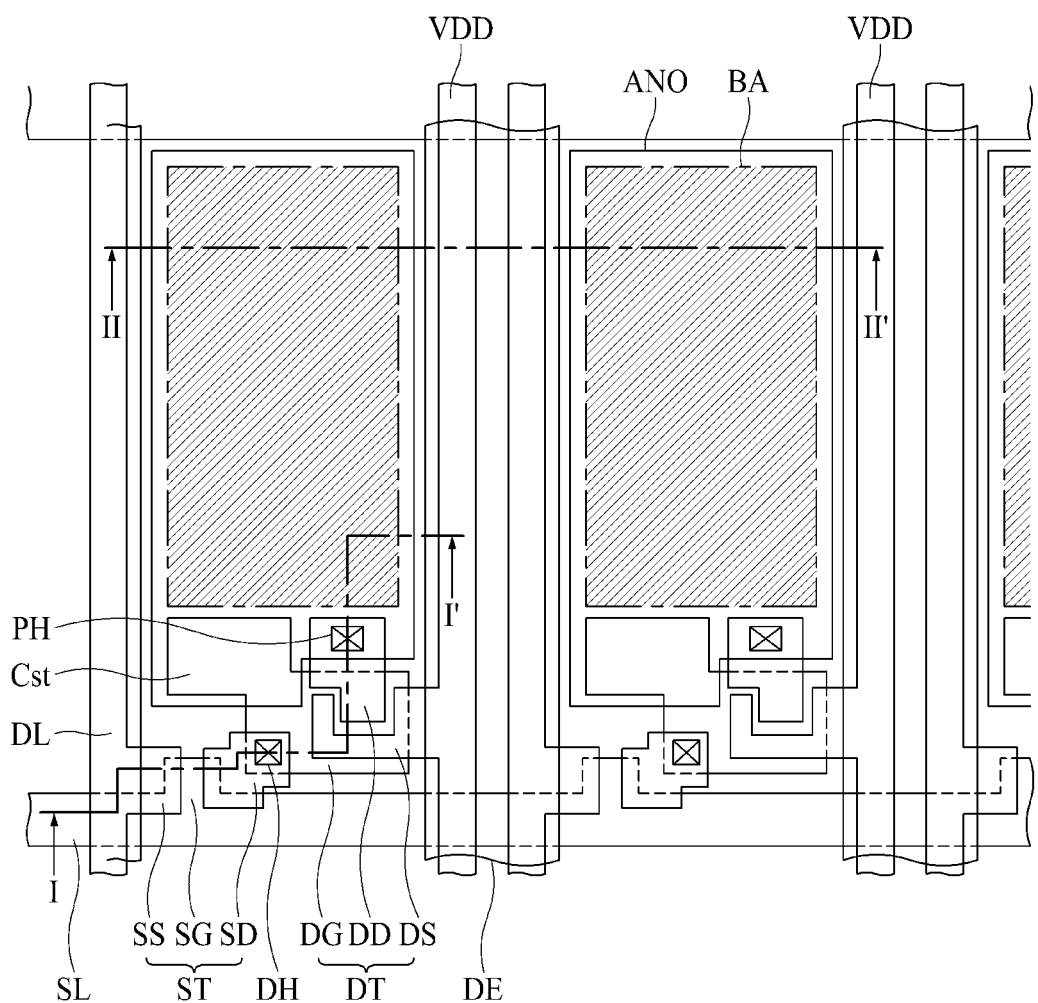
FIG. 3 is a plane view illustrating the subpixels according to an embodiment of the present disclosure.
Figure 4:
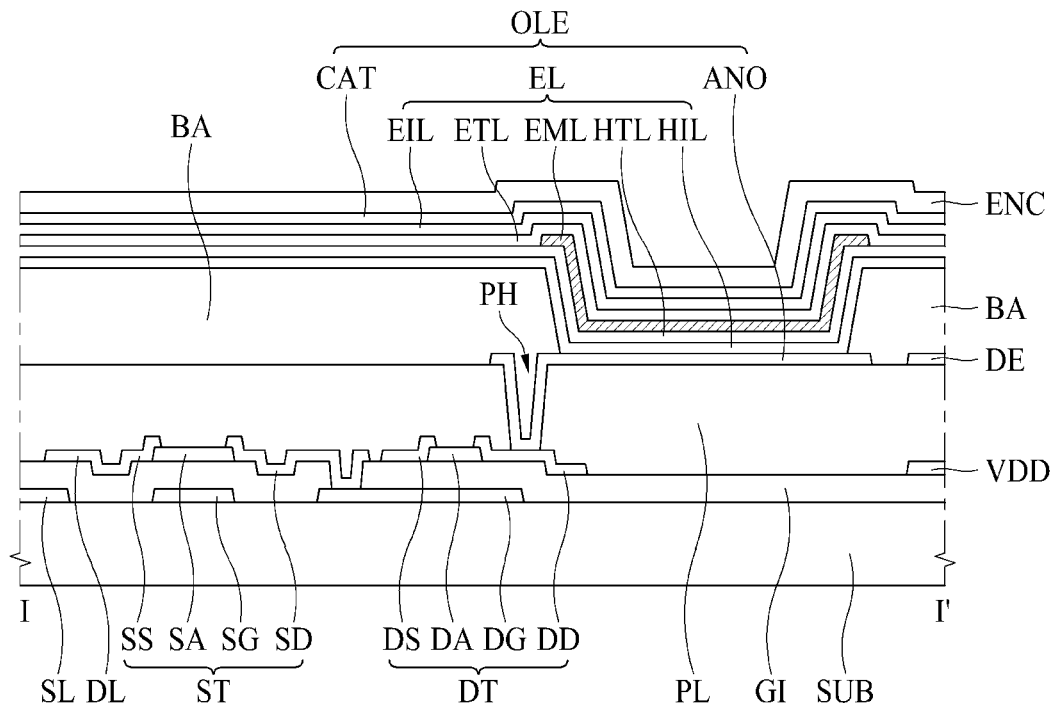
FIG. 4 is a cross-sectional view illustrating a structure of the electroluminescence display crossing the cutting line I-I' in FIG. 3 according to an embodiment of the present disclosure.

FIG. 2 is a circuit diagram illustrating a structure of one subpixel according to an embodiment of the present disclosure. FIG. 3 is a plan view illustrating the subpixels according to an embodiment of the present disclosure. FIG. 4 is a cross-sectional view illustrating a structure of the electroluminescence display crossing the cutting line I-I' in FIG. 3. Using FIGS. 2 to 4, we will explain about an organic light emitting diode display, one example of the electroluminescence display.

Referring to FIGS. 2 to 4, one pixel of the organic light emitting diode display may be defined by one scan line SL, one data line DL and one driving current line VDD. Any one pixel of the organic light emitting diode comprises a switching thin film transistor ST, a driving thin film transistor DT, an organic light emitting diode OLE and a storage capacitance Cst. The high level voltage is supplied to the driving current line VDD for driving the organic light emitting diode OLE.

For example, the switching thin film transistor ST may be disposed at the area where the scan line SL and the data line DL are crossed. The switching thin film transistor ST may include a switching gate electrode SG, a switching source electrode SS and a switching drain electrode SD. The switching gate electrode SG is connected to the scan line SL. The switching source electrode SS is connected to the data line DL. The switching drain electrode SD is connected to the driving thin film transistor DT. The switching thin film transistor ST works for selecting the pixel representing video image by supplying the data signal to the driving thin film transistor DT.

The driving thin film transistor DT works for driving the organic light emitting diode OLE of the pixel selected by the switching thin film transistor ST. The driving thin film transistor DT may include a driving gate electrode DG, a driving source electrode DS and a driving drain electrode DD. The driving gate electrode DG is connected to the switching drain electrode SD of the switching thin film transistor ST. The driving source electrode DS is connected to the driving current line VDD. The driving drain electrode DD is connected to the anode electrode ANO of the organic light emitting diode OLE. The storage capacitance Cst is disposed between the driving gate electrode DG of the driving thin film transistor DT and the anode electrode ANO of the organic light emitting diode OLE.

The driving thin film transistor DT may be disposed between the driving current line VDD and the organic light emitting diode OLE. The driving thin film transistor DT controls the amount of the electric current flowing from the driving current line VDD to the organic light emitting diode OLE according to the voltage value of the driving gate electrode DG connected to the switching drain electrode SD of the switching thin film transistor ST.

The organic light emitting diode OLE may include an anode electrode ANO, an organic light emitting layer EL and a cathode electrode CAT. The organic light emitting diode OLE may emit lights having a brightness controlled by the amount of the electric current controlled by the driving thin film transistor DT. In other words, the brightness of the organic light emitting diode OLE may be controlled by the amount of the electric current controlled by the driving thin film transistor DT. The anode electrode ANO of the organic light emitting diode OLE is connected to the driving drain electrode DD of the driving thin film transistor DT. The cathode electrode CAT is connected to the low level line VSS to which the low level voltage is supplied. The organic light emitting diode OLE is driven by the voltage difference between the high level voltage controlled by the driving thin film transistor DT and the low level voltage.

Referring to FIG. 4, we will explain about the cross sectional structure of the organic light emitting diode display according to the present disclosure. On the substrate SUB, a switching gate electrode SG, a driving gate electrode DG and a scan line SL are formed. A gate insulating layer GI is disposed on the substrate SUB as covering the switching gate electrode SG, the driving gate electrode DG and the scan line SL.

A switching semiconductor layer SA is formed on the gate insulating layer GI as overlapping with the switching gate electrode SG. A driving semiconductor layer DA is formed on the gate insulating layer GI as overlapping with the driving gate electrode DG. On the switching semiconductor layer SA, a switching source electrode SS and a switching drain electrode SD may be disposed with a predetermined distance there-between. On the driving semiconductor layer DA, a driving source electrode DS and a driving drain electrode DD may be disposed with a predetermined distance there-between.

The switching drain electrode SD of the switching thin film transistor ST is connected to the driving gate electrode DG of the driving thin film transistor DT through a drain contact hole DH formed at the gate insulating layer GI. It is required that the switching thin film transistor ST and the driving thin film transistor DT are prevented from any external influence. In addition, the surface of the substrate on which the thin film transistors ST and DT are formed is uneven, and has many step differences. In order for the organic light emitting diode EL to emit lights with superior efficiency, the organic light emitting layer should be formed on a smooth and flat surface. Therefore, it is preferable that a planarization layer PL is deposited over the whole surface of the substrate SUB in order for making the surface of the substrate SUB to be in smooth state and for protecting the elements. In other cases, a passivation layer may be further deposited under the planarization layer PL for covering the thin film transistors ST and DT. In this case, the elements include thin film transistor and the storage capacitance.

The anode electrode ANO of the organic light emitting diode is formed on the planarization layer PL. The anode electrode ANO is connected to the driving drain electrode DD of the driving thin film transistor DT through a pixel contact hole PH penetrating the planarization layer PL. The anode electrode ANO may be formed as having the maximum area within the pixel area defined by the scan line SL, the data line DL and the driving current line VDD.

A bank BA may be formed to define an emission area on the substrate SUB having the anode electrode ANO. The bank BA exposes the most area of the anode electrode ANO and distinguishes one anode electrode ANO from the neighboring anode electrode ANO. The exposed area of the anode electrode ANO by the bank BA is defined as the emission area. The organic light emitting layer EL is formed on the anode electrode ANO exposed by the bank BA. The cathode electrode CAT is formed on the organic light emitting layer EL.

An encapsulation layer ENC may be further disposed on the organic light emitting diode OLE. The encapsulation layer ENC may cover the whole surface of the substrate SUB on the cathode electrode CAT. The encapsulation layer ENC may protect the thin film transistors ST and DT and the organic light emitting diode OLE from the external impacts. In addition, the encapsulation layer ENC may prevent from the moisture or the foreign materials being invaded into the organic light emitting diode OLE, so that it may keep the life time of the organic light emitting diode for a long time.

The organic light emitting layer EL may include a hole injection layer HIL, a hole transport layer HTL, an emission layer EML, an electron transport layer ETL and an electron injection layer EIL. The hole injection layer HIL, the hole transport layer HTL, the electron transport layer ETL and the electron injection layer EIL may be covered on the whole surface of the substrate SUB as to be commonly deposited on all or some of the organic light emitting diodes OLE. The organic light emitting layer EL excepting the emission layer EML are commonly deposited over some of the pixels, so that it may be deposited over the whole or some surfaces of the substrate SUB. Here, the hole injection layer HIL and the hole transport layer HTL are called as the hole functional layer for enhancing the mobility of the hole into the emission layer EML. Likely, the electron injection layer EIL and the electron transport layer ETL are called as the electron functional layer for enhancing the mobility of the electron into the emission layer EML.

In the case that the organic light emitting layer EL emits a white color light, the emission layer EML may be disposed on the whole surface of the substrate SUB so as to be commonly deposited over all or some of the organic light emitting diode OLE. In that case, the color filters for representing specific colors at each pixel may be further disposed on or under the organic light emitting diode OLE.

In the case that the organic light emitting layer EL emits a specific color light at each subpixel, the emission layer EML may be separately formed at every each subpixel. For example, the red subpixel has a red emission layer, the green subpixel has a green emission layer and the blue subpixel has a blue emission layer. In other cases, the color filters are further included for more enhancing the color gamut.

For the organic light emitting diode display, the thin film transistors ST and DT are formed on the substrate SUB and then the organic light emitting diode OLE is stacked thereon. According to the emission direction of the light from the organic light emitting diode OLE, the display may be categorized as the top emission type, the bottom emission type and the double emission type. For the top emission type, the light is emitted from the organic light emitting diode OLE to the encapsulation layer ENC disposed at upper side. For the bottom emission type, the light is emitted from the organic light emitting diode OLE to the substrate SUB disposed at lower side. For the double emission type, the light is emitted to the upper side and the lower side at the same time.

For the top emission type, as shown in FIG. 3, the anode electrode ANO has a transparent conductive layer and a high reflective metal layer under the transparent conductive layer. The transparent conductive layer may include any selected one of an indium thin oxide (or ITO), an indium zinc oxide (or IZO), an indium zinc tin oxide (or IZTO), an indium cesium oxide (or ICO) or an indium tungsten oxide (or IWO). The high reflective metal layer may include any selected one of gold (Au), silver (Ag), aluminum (Al), molybdenum (Mo), magnesium (Mg) or alloy thereof.

For the bottom emission type, the anode electrode ANO may be made of a transparent conductive material. In some cases, even though the opaque metal material is used, a very thin metal layer may ensure some degrees of transparency, so that the metal layer only may be used for the anode electrode ANO in the bottom emission type.

The anode electrode ANO is one electrode for supplying the hole. The hole injection layer HIL injects the hole received from the anode electrode ANO into the hole transport layer HTL. The hole injection layer HIL may include CuPc(cupper phthalocyanine), PEDOT(poly(3,4)-ethylenedioxythiophene), PANI(polyaniline) or NPD(N,N-dinaphthyl-N,N'-diphenyl benzidine). In some cases, the hole injection layer HIL may be omitted. The hole transport layer HTL transfers the hole received from the hole injection layer HIL into the emission layer EML. The hole transport layer HTL may include NPD(N,N-dinaphthyl-N,N'-diphenyl benzidine), TPD(N,N'-bis-(3-methylphenyl)-N,N'-bis-(phenyl)-benzidine), TCTA(4-(9H-carbazol-9-yl)-N,N-bis[4-(9H-carbazol-9-yl)phenyl]-benzenamine), CBP(4,4'-N, N'-dicarbazole-biphenyl), s-TAD or MTDATA(4,4',4"-Tris(N-3-methylphenyl-N-phenyl-amino)-triphenylamine).

The cathode electrode CAT is the electrode for supplying the electron. The electron injection layer EIL injects the electron received from the cathode electrode CAT into the electron transport layer ETL. The electron injection layer EIL may be omitted. The electron transport layer ETL transfers the electron received from the electron injection layer EIL into the emission layer EML. The electron transport layer ETL may include PBD(2-(4-biphenyl)-5-(4-tert-butylphenyl)-1,3,4-oxadiazole), TAZ(3-(4-biphenyl)-4-phenyl-5-tertbutylphenyl-1,2,4-triazole), Liq(8-hydroxyquinolinolato-lithium), BAlq(Bis(2-methyl-8-quinolinolate)-4-(phenylphenolato)aluminium), TPBi(2,2', 2'-(1,3,5-benzinetriyl)-tris(1-phenyl-1-H-benzimidazole) and so on.

At the emission layer EML, the hole supplied from the hole transport layer HTL and the electron supplied from the electron transport layer ETL are combined and the exciton is generated. When the exciton is fall down from the excited state to the ground state, the lights are emitted.

The emission layer EML may include a host and a dopant. In addition, the emission layer EML may include a material emitting the red color lights, the green color lights, the blue color lights and/or the white color lights. The emission layer EML may be formed by using the phosphor materials or the fluorescent materials.

In the case that the emission layer EML emits the red color light, the emission layer EML may be the phosphor material comprising the host material including CBP(carbazole biphenyl) or mCP(1,3-bis(carbazol-9-yl), and the dopant material including at least selected one of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum). In other case, the emission layer EML may be the fluorescent material including PBD:Eu(DBM)3(Phen) or Perylene.

In the case that the emission layer EML emits the green color light, the emission layer EML may be the phosphor material comprising the host material including CBP or mCP and the dopant material including Ir(ppy)3(fac tris(2-phenylpyridine)iridium). In other case, the emission layer EML may be the fluorescent material comprising Alq3 (tris(8-hydroxyquinolino)aluminum).

In the case that the emission layer EML emits the blue color light, the emission layer EML may be the phosphor material comprising the host material including CBP or mCP and the dopant material including (4,6-F2ppy)2Irpic or L2BD111.

In order to get superior emission efficiency and performance, the exciton should be formed at the middle portion of the emission layer EML. Otherwise, when the combining area or the emission area where the electron and the hole are combined to generate the exciton is shifted from the middle area of the emission layer EML, the emission performance is not expected to have the best condition. That is, as the lights are not generated at the proper position of the emission layer EML, the correct color may not be emitted. In addition, the exciton generation may be occurred at the hole functional layer or the electron functional layer, so that the life time of the organic light emitting diode may be reduced.

In order to generate the exciton within the emission layer EML, the hole and the electron should be transferred into the emission layer properly. To do so, the p-type impurity would be doped into the hole functional layers and the n-type impurity would be doped into the electron functional layers.

For example, by doping the p-type impurity with 1~1.2% into the hole injection layer HIL and/or the hole transport layer HTL, the hole mobility from the hole functional layer to the emission layer EL can be enhanced. In addition, by doping the n-type impurity with several % into the electron injection layer EIL and/or the electron transport layer ETL, the electron mobility from the electron functional layer to the emission layer EL can be enhanced. As the results, the power consumption may be lowered and the emission efficiency may be enhanced. Here, the doping % is the unit of volume amount of the impurity. For example, the doping % may be the volume % of the impurity to the volume of the host material.

In one example, the hole functional layer may include the host material and the dopant material. The dopant material, as the p-type impurity material, may have the volume ratio of 1.0~1.2% to the volume of the host material. In addition, the electron functional layer may also include the host material and the dopant material. The dopant material, as the n-type impurity material, may have the volume ratio of 1.0~1.2% to the volume of the host material.

Instead of doping the p-type impurity into the hole functional layer and the n-type impurity into the electron functional layer, an additional p-type impurity doped hole functional layer and an additional n-type impurity doped electron functional layer may be included into the organic light emitting layer EL. The additional p-type impurity doped hole functional layer may be a hole transport catalyst layer and the additional n-type impurity doped electron functional layer may be an electron transport catalyst layer.

Figure 5:
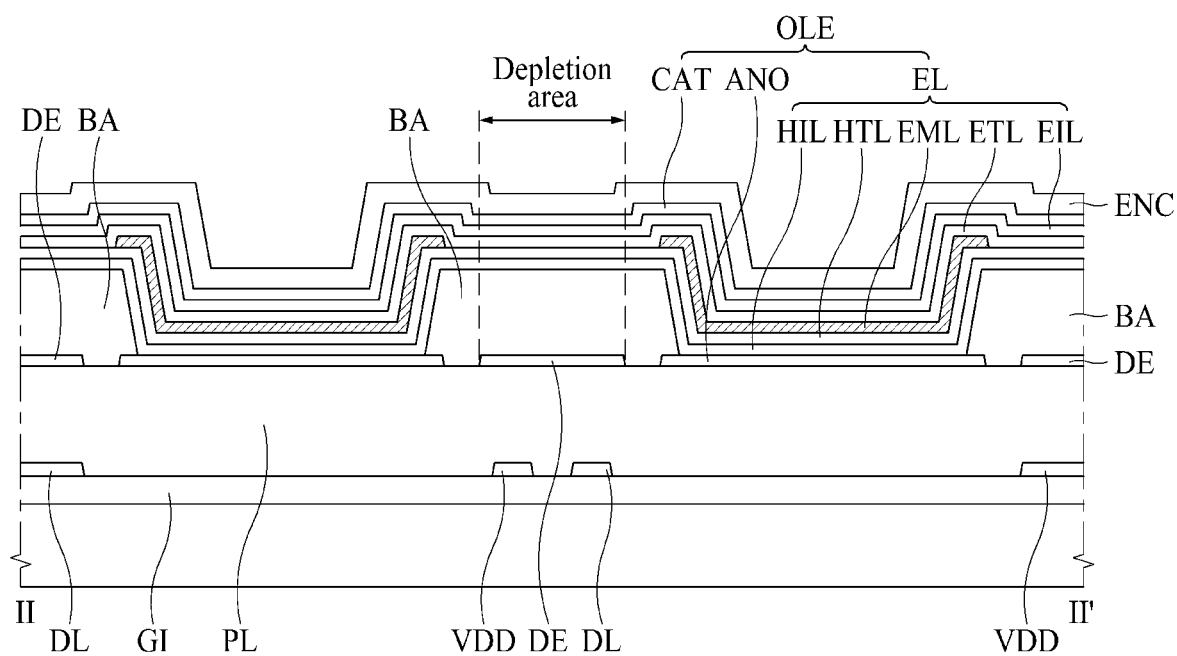
FIG. 5 is a cross-sectional view illustrating a structure of the electroluminescence display crossing the cutting line II-II' in FIG. 3 according to an embodiment of the present disclosure.

By doping the p-type impurity into the hole functional layer such as the hole injection layer HIL and/or the hole transport layer HTL, the light emitting layer may be enhanced, but it may cause any unexpected problem. To enhance the light emitting layer without any other problems, the present disclosure suggests a new structure as shown in FIG. 5. FIG. 5 is a cross-sectional view illustrating a structure of the electroluminescence display crossing the cutting line II-II' in FIG. 3.

Referring to FIG. 5, an electroluminescence display according to the present disclosure comprises a depletion electrode DE disposed between pixels. The depletion electrode DE may be disposed between two neighboring anode electrodes ANO with a predetermined distance on a planarization layer PL. Between the anode electrodes ANO, a data line DL and a driving current line VDD may be located under the planarization layer PL. The depletion electrode DE may be formed as covering the data line DL and/or the driving current line VDD.

As disposed between two neighboring organic light emitting diodes OLE, the depletion electrode DE may act the role for blocking the lateral leakage current induced through the hole function layer deposited commonly over the neighboring two pixels. To block the lateral leakage current, the depletion electrode DE is supplied with a high-level voltage equal to or higher than the high level voltage for driving the organic light emitting diode OLE according to one embodiment. As a result, a depletion area may be formed at the hole injection layer HIL and/or the hole transport layer HTL deposited over the depletion electrode DE.

For example, the depletion electrode DE may be connected to the driving current line VDD. In that case, the depletion electrode DE may be connected to the driving current line VDD via a contact hole penetrating the planarization layer PL formed at the non-display area NDA.

In another example, the GIP type gate driver 200 may use an additional line supplied with a high level voltage signal higher than the high level voltage signal applied to the driving current line VDD. In that case, the depletion electrode DE may be extended to the non-display area NDA and connected to the additional line of the gate driver 200.

Figure 6A:
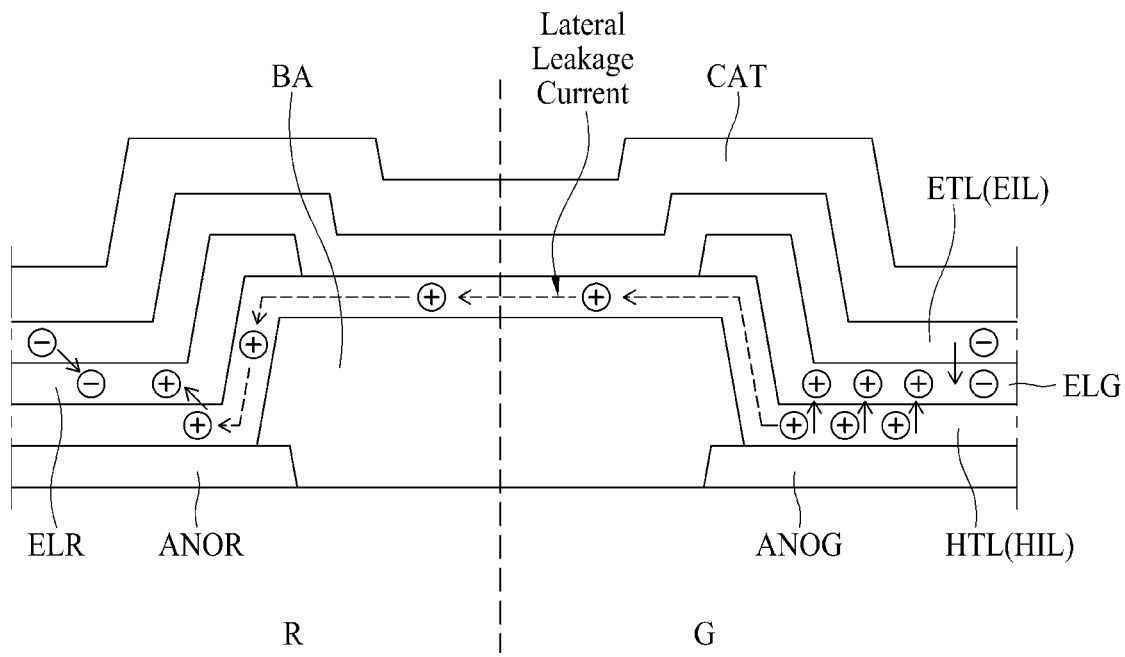
FIG. 6A is a cross-sectional view illustrating a structure of the light emitting diode without depletion electrode according to comparative example.
Figure 6B:
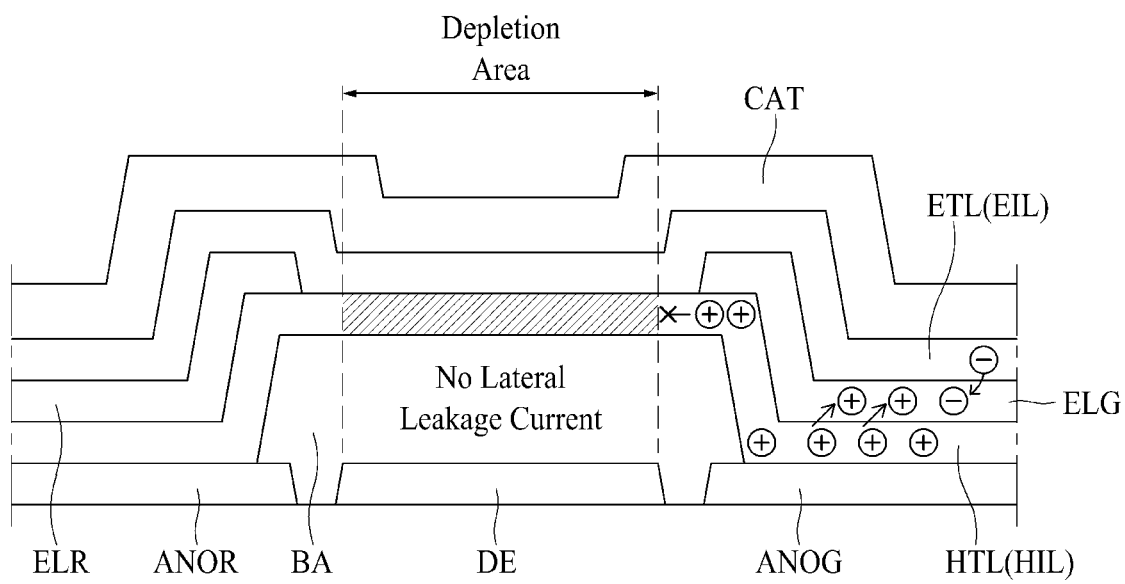
FIG. 6B is a cross-sectional view illustrating a structure of a light emitting diode according one embodiment of the present disclosure.

Hereinafter, referring to figures, the depletion electrode is explained according to the present disclosure in detail. FIG. 6A is a cross-sectional view illustrating a structure of the light emitting diode without depletion electrode according to comparative example. FIG. 6B is a cross-sectional view illustrating a structure of a light emitting diode according one embodiment of the present disclosure. Here, in convenience, the hole transport layer HTL is only shown as the representative layer for the hole functional layer and the electron transport layer ETL is only shown as the representative layer for the electron functional layer.

In FIG. 6A, we explain about the case for representing pure green color light in which the high level voltage is applied to the green pixel only in the unit pixel including red, green and blue (sub) pixels. Referring to FIG. 6A, the driving voltage of 6V is applied to the green anode electrode ANOG disposed in the green pixel G. At the same time, the driving voltage of 0V is applied to the red anode electrode ANOR disposed in the red pixel R. The low level voltage of 0V is applied to the cathode electrode CAT. Therefore, there are voltage difference of 6V is applied between the green anode electrode ANOG and the cathode electrode CAT, so that the hole may move from the hole transport layer HTL close to the green anode electrode ANOG to the green emission layer ELG. At the same time, the electron may move from the electron transport layer ETL close to the cathode electrode CAT to the green emission layer ELG. At the green emission layer EGL, the hole and the electron are combined and the green color light is emitted out.

On the contrary, there is no voltage difference between the red anode electrode ANOR disposed in the red pixel R and the cathode electrode CAT. A hole and an electron do not move to the red emission layer ELR. As a result, light is not emitted from the red emission layer ELR.

In the case that the red pixel R and the green pixel G is very close as the pixel density is increased, the holes injected from the green anode electrode ANOG may move into the red pixel R neighboring the green pixel G due to the p-type impurities distributed in the hole transport layer HTL. As the results, a little amount of red lights may be emitted from the red emission layer ELR.

In this case, even though the operation is designed to represent the pure green color light in one unit pixel, the pure green color light is not reproduced because that the red color light is emitted due to the leaked current. This problem may be severely occurred at the high resolution display in which the distance or gap between the neighboring anode electrodes ANO is very small or narrow.

The electroluminescence display according to the present disclosure further includes a depletion electrode DE between the anode electrodes ANO. The depletion electrode DE is supplied with a high-level voltage equal to or larger than the voltage applied to the anode electrode ANO. As a result, an electric field is formed between the depletion electrode DE and the cathode electrode CAT. According to this electric field, a depletion area is formed. The depletion area may be defined as an insulating region within a conductive, doped semiconductor material where the mobile charge carriers have been diffused away, or have been forced away by an electric field. Therefore, the hole, one of the conductive materials, cannot pass through this area, so that the lateral leakage current may be blocked.

Referring to FIG. 6B, the depletion area according to the present disclosure may include a depletion electrode DE, a bank BA, a hole injection layer HIL, a hole transport layer HTL, an electron transport layer ETL, an electron injection layer EIL and a cathode electrode CAT which are stacked sequentially. Here, the p-type impurity is doped into the hole injection layer HIL and/or the hole transport layer HTL, and the n-type impurity is doped into the electron injection layer EIL and/or the electron transport layer ETL. That is, these stacked materials may form a semiconductor structure having a formation in the PN junction of the p-type semiconductor material and the n-type semiconductor material.

Under the semiconductor having the formation in the PN junction, the depletion electrode DE is disposed with the bank BA, a kind of organic insulating layer. As the high level voltage and the low level voltage are applied to the depletion electrode DE and the cathode electrode CAT, respectively, an electric field is formed at the semiconductor having the formation in PN junction. By this electric field, the hole is prevented from being laterally flow through the layer having p-type impurities. In another word, as the depletion electrode DE works as the gate at the hole injection layer HIL and/or the hole transport layer HTL having the p-type impurities and forms the depletion area to block the lateral current.

Hereinafter, the features of the depletion electrode DE are explained according to the present disclosure. For enhancing the reality of the display, one of the representative methods is to increase the resolution. For example, the HD (High Density) rate resolution has the pixels of 1280×720. Here, a pixel means the unit pixel representing one video pixel. Considering that the unit pixel has a red subpixel, a green subpixel and a blue subpixel, the HD rate resolution has the pixels of 3840×720.

In the case of a display for the smart phone in that the diagonal length is 6 inches and the resolution is HD rate, the unit pixel density is about 250PPI (Pixel Per Inch) and the subpixel density is about 750PPI. As increasing the HD resolution up to FHD (Full High Density) rate or QHD (Quadra High Density) rate, the unit pixel density is increased to 400PPI or 500PPI or higher. The subpixel density is increased over 1,000PPI.

As the resolution increases, the distance or gap between subpixels will be shorter and shorter. As a result, the hole may be easily and severely leaked to the neighboring pixels along to the hole functional layer. To prevent the lateral leakage current, the doping amount of the p-type impurity may be lowered. However, the p-type impurity for increasing the efficiency of organic emitting diode may cause the degradation of the efficiency of the light emission or the increase of the power consumption.

On the contrary, in the case that the depletion electrode DE is disposed between two neighboring anode electrodes ANO as suggested in the present disclosure, even though the gap between two neighboring pixels is getting closer as the pixel density is increased, the lateral leakage current may not be occurred. In addition, even though increasing the doping amount of the p-type impurity into the hole functional layer, the lateral leakage current may not be occurred. Therefore, the p-type impurity can be more doped into the display having the ultra-high density such as QHD or more than having the low density. As the results, for the ultra-high density display, the numbers of the electron-hole are increased and then the emission efficiency would be increased or enhanced. As the hole can be transferred into the emission layer with lower energy, the power consumption may be more reduced.

Figure 7:
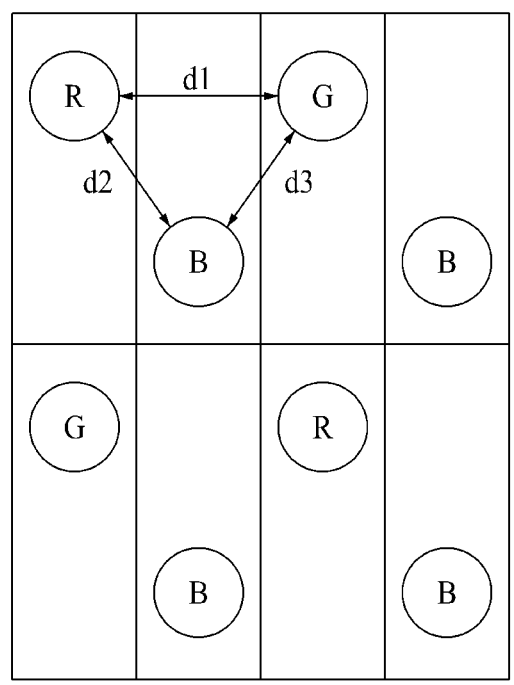
FIG. 7 is a diagram showing a structure of the pixel according to one embodiment of the present disclosure.

The Table 1 shows the relationship between the distance between the neighboring anode electrodes and the doping amount of the p-type impurity according to the pixel density rate. FIG. 7 is a diagram showing a structure of the pixel according to one embodiment of the present disclosure.

TABLE 1

| Unit Pixel Density | Gap between Anodes | P-doping (No Depletion) | Depletion Electrode | P-doping (with Depletion) |
|---|---|---|---|---|
| 200 PPI | a μm | <1.2% | X | >1.2% |
| 300 PPI | b μm | <1.0% | O | >1.2% |
| 400 PPI | c μm | <0.6% | O | >1.2% |
| 800 PPI | d μm | <0.4% | O | >1.2% |

Here, the 'Unit Pixel Density' means the density of the unit pixels. For example, the unit pixel may include three subpixels such as a red subpixel, a green subpixel and a blue subpixel. The 'Gap between Anodes' means the distance between two neighboring anode electrodes. Referring to FIG. 7, it means the shortest distance among d1, d2 and d3. In Table 1, the value of a, b, c and d are satisfied the relationship of a>b>c>d. The 'P-doping (No Depletion)' means the concentration of the p-type impurity for minimizing the lateral leakage current without the depletion electrode. With these concentrations, the lateral leakage current is not eliminated, but the effect of the lateral leakage current is minimized. The 'Depletion Electrode' means the existence of the depletion electrode. The 'P-doping (with Depletion)' means the concentration of the p-type impurity with the depletion electrode. The '>1.2%' means that the emission efficiency of the organic light emitting diode can be maximized as there is no lateral leakage current.

As shown in the Table 1 and FIG. 7, at the pixel density lower than 200PPI, the distance between the anode electrodes is a μm or more. For example, it may be 30 μm. In that case, when the p-type impurity is doped with 1.2% into the hole transport layer HTL, the lateral leakage current may not be occurred between the two neighboring subpixels, or the efficiency of the lateral leakage current is very little, even though the lateral leakage current is occurred. Therefore, the present disclosure provides the organic light emitting display having the superior color gamut property.

As the pixel density is increased over 300PPI, the size of each subpixel will be reduced. When the size of the organic light emitting diode OLE is reduced with the same ratio of the reduction ratio of the subpixel, it is not required to increase the concentration of 'P-doping' for keeping the brightness because the aperture ratio is not reduced. However, as the gap between the anode electrodes ANO is getting closer, the lateral leakage current due to the p-type impurity may be occurred. In order to suppress the lateral leakage current, one method is the reduction of the doping concentration. However, this method cannot solve the lateral leakage current problem ultimately. In Table 1, the concentration of 'P-doping' without depletion electrode does not means the concentration that does not occur the lateral leakage current. It means that there is no problem on the display quality by the lateral leakage current. In this case, as reducing the concentration of 'P-doping' in order to reduce the lateral leakage current, the brightness of the organic light emitting diode OLE is degraded. In order to compensate the lowered brightness, more power consumption may be required.

With the depletion electrode DE between the anode electrodes ANO, the lateral leakage current does not occur even though the p-type impurity is doped with 1.2% or more when the pixel density is 800PPI or higher. Therefore, the present disclosure suggests an ultra-high density organic light emitting diode display having the superior color gamut, the enhanced emission efficiency and the lowered power consumption.

When the display has the large area of which diagonal length is 40 inches or more with HD rate, the pixel density may be 200PPI or less. In this case, without the depletion electrode, the lateral leakage current may not be occurred. Currently, the large TV monitor having the ultra-high density resolution may have the pixel density of 200PPI or higher. In that case, the video quality may be degraded by the lateral leakage current. Applying the depletion electrode according to the present disclosure, the lateral leakage current may be ultimately blocked, so that the high video quality can be ensured for the large area TV monitor without the color distortion and the gamma distortion at the low gray scale.

Until now, our explanation is focused on the case that the emission layers representing a specific color light at one pixel is formed at each pixel. For another case, the emission layer representing a white color light is deposited over the whole surface of the substrate and the color filters are formed at each pixel. In this case, the depletion electrode may be further disposed between pixels to block the lateral leakage current. Therefore, the superior video quality without the color distortion/degradation can ensured.

Until now, the p-type impurity is doped at the hole functional layers. This is for explaining the characteristics of the present disclosure, so it is not limited on the p-type impurity only. For example, the emission layer has the p-type impurity as close to the anode electrode and the n-type impurity as close to the cathode electrode. In that case, the hole functional layer and the electron functional layer may not be included into the organic light emitting layer. As the pixel density is increased, the color degradation may be occurred by the lateral leakage current through the emission layer. In this case, the lateral leakage current may be blocked by applying the depletion electrode according to the present disclosure.

Figure 8A:
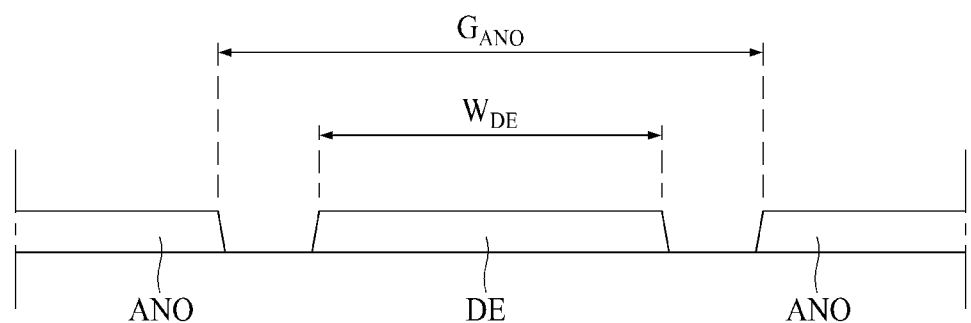
FIG. 8A is a cross-sectional view illustrating a layout structure of a depletion electrode disposed between two neighboring anode electrodes according to one embodiment of the present disclosure.
Figure 8B:
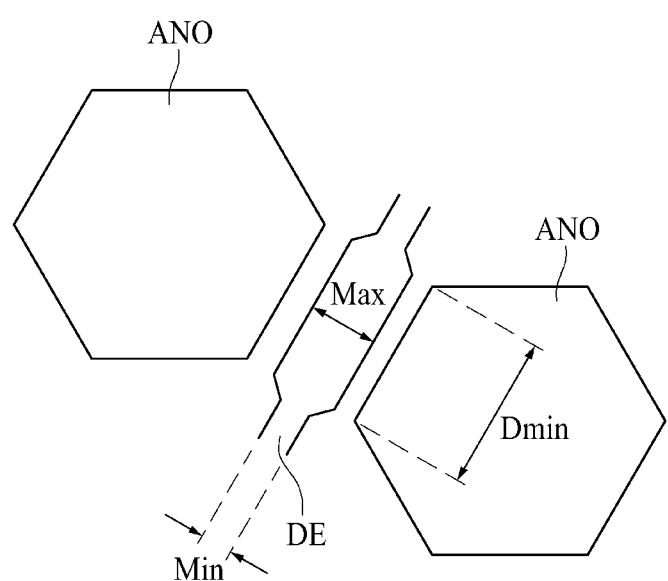
FIG. 8B is a cross-sectional view illustrating a layout structure of a depletion electrode disposed between two neighboring anode electrodes according to another embodiment of the present disclosure.

Hereinafter, referring to the figures, we will explain about the shape structure and the layout structure of the depletion electrode according to some embodiments of the present disclosure. FIG. 8A is a cross-sectional view illustrating a layout structure of a depletion electrode disposed between two neighboring anode electrodes according to one embodiment of the present disclosure. FIG. 8B is a cross-sectional view illustrating a layout structure of a depletion electrode disposed between two neighboring anode electrodes according to another embodiment of the present disclosure.

Referring to FIG. 8A, the depletion electrode DE may be disposed between neighboring two anode electrodes ANO. For example, two anode electrodes ANO may be apart from each other with an anode gap $G_{ANO}$. The depletion electrode DE may be disposed as apart from each anode electrode ANO with a predetermined distance. The depletion electrode DE is not contacted to each anode electrode ANO. The depletion electrode DE may have a width range from 30% to 60% of the anode gap $G_{ANO}$. The relationship between the anode gap $G_{ANO}$ and the width of the depletion electrode $W_{DE}$ may be defined as following equation.

$$G_{ANO} \times 30\% \le W_{DE} \le G_{ANO} \times 60\%$$

Referring to FIG. 8B, the anode electrode ANO may include a thin plate of a circle, an ellipse or an polygon such as a triangle, a rectangle, a pentagon, a hexagon or an octagon. The closest length between the two neighboring anode electrodes ANO may be defined as an anode gap $G_{ANO}$. A depletion electrode DE may be disposed between the neighboring two anode electrodes ANO. The lateral leakage current may have the maximum value at the minimum area Dmin where the anode gap $G_{ANO}$ has minimum value. Therefore, to ensure the effects of the depletion electrode DE, the width $W_{DE}$ of the depletion electrode DE may have the maximum value Max at the minimum area Dmin where the anode gap $G_{ANO}$ has the minimum value. The width $W_{DE}$ of the depletion electrode DE may have the minimum value Min at the area where the anode gap $G_{ANO}$ has a larger value than the minimum value. In other words, as the lateral leakage current where the anode gap $G_{ANO}$ is relatively wider may be very small amount or may not be occurred where the anode gap $G_{ANO}$ is relatively narrower, the width $W_{DE}$ of the depletion electrode DE where the anode gap $G_{ANO}$ is relatively wider may be narrower than that where the anode gap $G_{ANO}$ is relatively narrower. Therefore, the width $W_{DE}$ of the depletion electrode DE formed at the area excepting the minimum area Dmin where the anode gap $G_{ANO}$ has the minimum value may be equal or less than the width $W_{DE}$ of the depletion electrode DE formed at the minimum area Dmin where the anode gap $G_{ANO}$ has the minimum value. By setting the depletion electrode DE at the area excepting the minimum area Dmin has the minimum width Min, the depletion electrodes DE having the maximum width Max at the minimum areas Dmin can be electrically connected each other using the depletion electrodes DE having the minimum width Min. The width $W_{DE}$ of the depletion electrodes DE may have various values, for example, at least two widths, so that the depletion electrodes DE can be disposed on the display panel with an optimum structure.

Figure 9:
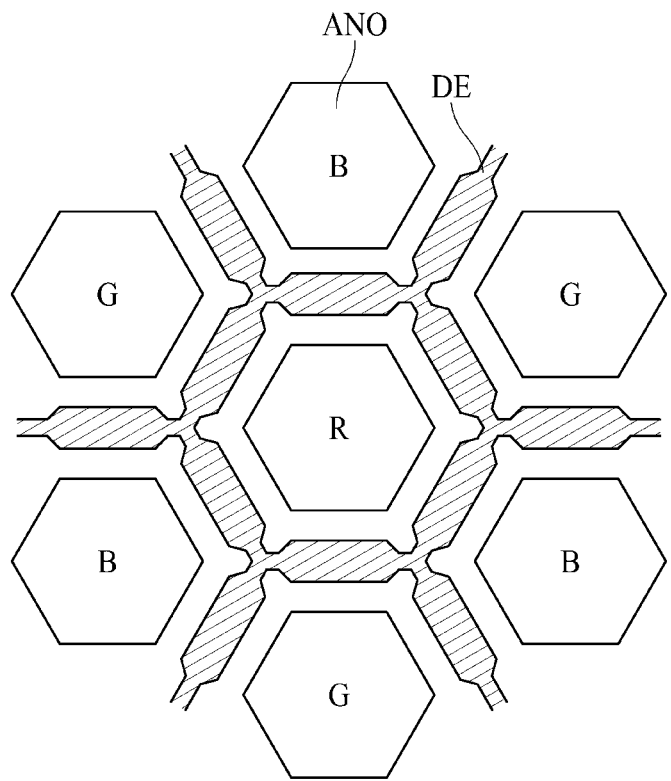
FIG. 9 is a plan view illustrating a layout structure of a depletion electrode according to a first example of the present disclosure.

Hereinafter, referring to figures, we will explain about the various configurations of the depletion electrode according to the present disclosure. FIG. 9 is a plane view illustrating a layout structure of a depletion electrode according to a first example of the present disclosure.

Referring to FIG. 9, a plurality of anode electrodes ANO is disposed in a matrix manner. In FIG. 9, the shape of the anode electrode ANO has the hexagonal shape. In this case, the anode electrodes ANO are disposed as the honeycomb shape. Each of the anode electrodes ANO may be corresponding to the subpixel. Therefore, each of the anode electrodes ANO may be distributed with a specific color. One unit pixel may include one red subpixel R, one green subpixel G and one blue subpixel B configuring one triangular shape. One depletion electrode DE may be disposed between two anode electrodes ANO. The depletion electrode DE may have a closed curved line fully surrounding any one anode electrode ANO. As the results, the anode electrode ANO may be isolated from any neighboring anode electrode ANO.

As explained with FIG. 8B, the width $W_{DE}$ of the depletion electrode DE may have the maximum value at the minimum area Dmin where the anode gap $G_{ANO}$ has the minimum value, and it may have the minimum value at other areas excepting the minimum area Dmin. For another example, the width $W_{DE}$ of the depletion electrode DE is not limited to the maximum value or the minimum value. The depletion electrode width $W_{DE}$ at the minimum area Dmin may have relatively larger value than those at the other area. The depletion electrode DE may have the closed curved shapes connecting over the whole surface of the substrate.

By adjusting the width $W_{DE}$ of the depletion electrode DE, the lateral leakage current may be ultimately and effectively blocked.

Figure 10:
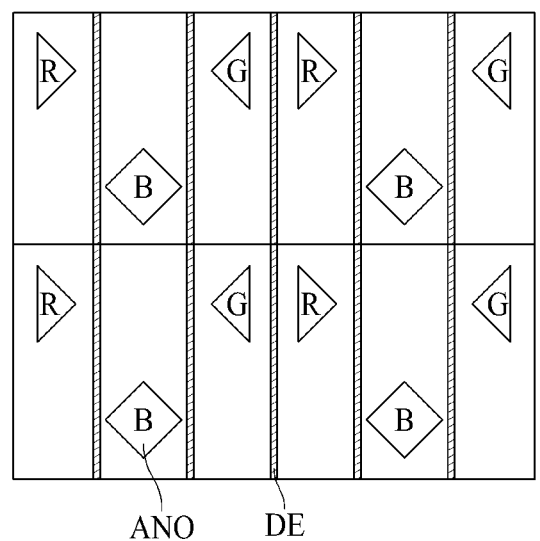
FIG. 10 is a plan view illustrating a layout structure of a depletion electrode according to a second example of the present disclosure.

FIG. 10 is a plan view illustrating a layout structure of a depletion electrode according to a second example of the present disclosure. The pixel arrangement in FIG. 10 shows the case in which the area of the blue subpixel has larger area than other subpixels in order to ensure the blue color gamut more clearly than those of the red subpixel and the green subpixel. When the emission efficiency of the blue emission layer is lower than those of the red emission layer and the green emission layer, the blue subpixel may have a larger area than the red subpixel and the green subpixel.

Referring to FIG. 10, a plurality of anode electrodes ANO is disposed in a matrix manner. The anode electrode ANO may have a triangular shape or a rhombus (or diamond) shape. In detail, the anode electrodes ANO for the red subpixel and the green subpixel may have the triangular shape, but the anode electrode ANO of the blue subpixel may have the rhombus shape. The same color subpixels are disposed along to the vertical direction, i.e., Y-axis, and a plurality of group including the red subpixel, the green subpixel and the blue subpixel are sequentially disposed along to the horizontal direction, i.e., X-axis. In FIG. 10, the subpixels are disposed in a zigzag layout, but it is not limited to this style, but they may be disposed in a parallel type.

By disposing the depletion electrode DE between the anode electrodes ANO emitting the different color light, the lateral leakage light can be prevented. For example, the depletion electrode DE may have a segment line shape parallel to the Y-axis. A plurality of depletion electrodes DE may be disposed between the red subpixel column and the blue subpixel column, between the blue subpixel column and the green subpixel column, and between the green subpixel column and the red subpixel column.

Along to the Y-axis, two neighboring anode electrodes ANO have the same color emission layer. Even though there is no depletion electrode DE between two neighboring anode electrodes ANO allocated to the same color subpixels, as shown in FIG. 10, the lateral leakage current may be occurred along to the Y-axis. However, as this lateral leakage current is affected to the anode electrode ANO allocated to the same color subpixel, the color deterioration cannot be recognized by the observer. That is, the lateral leakage current may not be affected to the degradation of the video quality.

On the contrary, in the view point of unit pixel, the lateral leakage current may occur the color deterioration when an unit pixel located upper row represents the pure red color light while the another unit pixel located just under row represents the pure blue color light. The lateral leakage current from the red subpixel of the upper row may be affected to the blue subpixel of the lower row, and the lateral leakage current from the blue subpixel of lower low may be affected to the red subpixel of the upper row. As the results, the color deterioration may be occurred.

This case may be very rarely occurred. For the most case, this condition is not generally occurred. However, for the small display having the diagonal length of 4 inches or less used for the virtual reality system or the augmented reality system, it is preferable that the depletion electrode DE is disposed between two neighboring anode electrodes ANO representing the same color light to block the lateral leakage current perfectly.

FIG. 10 shows that the depletion electrode DE has the same width at all portions. As shown in FIG. 8, the depletion electrode DE may have the maximum width at the minimum area between the anode electrode for the red subpixel and the anode electrode for the blue subpixel, and the depletion electrode DE may have the minimum width at other areas excepting the minimum area.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a first pixel defined for representing a first color on a substrate;
   a second pixel defined for representing a second color on the substrate;
   a first anode electrode at the first pixel on a planarization layer;
   a second anode electrode at the second pixel on the planarization layer;
   a data line and a driving current line between the first anode electrode and the second electrode;
   a hole functional layer on the first anode electrode and the second anode electrode;
   an emission layer on the hole functional layer;
   an electron functional layer on the emission layer;
   a cathode electrode on the electron functional layer; and
   a depletion electrode forming a depletion area between the first anode electrode and the second anode electrode,
   wherein the depletion electrode covers the data line and driving current line on the planarization layer,
   wherein the depletion electrode and the cathode electrode are configured to form an electric field there-between, wherein the hole functional layer and the electron functional layer are commonly and continuously disposed on a display area including the first pixel, the depletion area and the second pixel, and wherein the depletion electrode is apart from the first anode electrode and the second anode electrode with a predetermined distance, and is formed in a same layer as the first anode electrode and the second anode electrode.

2. The electroluminescence display of claim 1, wherein the depletion electrode has a width in a range of 30% to 60% of a gap between the first anode electrode and the second anode electrode.

3. The electroluminescence display of claim 1, wherein the depletion electrode has a closed curve shape surrounding at least one of the first anode electrode and the second anode electrode.

4. The electroluminescence display of claim 1, wherein a width of the depletion electrode has at least two different widths.

5. The electroluminescence display of claim 4, wherein the depletion electrode has a maximum width at a minimum area where a distance between the first anode electrode and the second anode electrode has a minimum value, and wherein the depletion electrode has a minimum width at other areas excepting the minimum area.

6. The electroluminescence display of claim 1, wherein the substrate includes:

a display area having the first pixel and the second pixel; and a non-display area surrounding the display area, and wherein the depletion electrode is connected to a line disposed at the non-display area for supplying a high level voltage.

7. The electroluminescence display of claim 1, wherein the depletion electrode receives a voltage equal to or higher than a voltage of the first anode electrode and a voltage of the second anode electrode.

8. The electroluminescence display of claim 1, wherein, over the depletion electrode, the hole functional layer and the electron functional layer are formed in a junction, without the emission layer there-between.

9. The electroluminescence display of claim 1, wherein the cathode electrode is connected to a low level voltage line supplied with a low level voltage, the depletion electrode is connected to the driving current line supplied with a high level voltage, and the first anode electrode and the second anode electrode are supplied with one voltage value in a range of the high level voltage and the low level voltage.

10. The electroluminescence display of claim 1, wherein the emission layer includes:

a first emission layer overlapping with the first anode electrode; and a second emission layer overlapping with the second anode electrode.

11. The electroluminescence display of claim 1, wherein the hole functional layer includes a p-type impurity of 1.0% concentration at least.

12. The electroluminescence display of claim 11, wherein the hole functional layer includes:

a hole injection layer on the first anode electrode and the second anode electrode; and a hole transport layer on the hole injection layer.

13. The electroluminescence display of claim 1, wherein the electron functional layer includes:

an electron transport layer on the emission layer; and an electron injection layer on the electron transport layer.

14. The electroluminescence display of claim 1, further comprising:

a third pixel defined for representing a third color light, close to at least one of the first pixel and the second pixel; and a third anode electrode at the third pixel, wherein the depletion electrode forms the depletion areas between the first anode electrode and the third anode electrode, and between the second anode electrode and the third anode electrode.

15. The electroluminescence display of claim 14, wherein the first color, the second color and the third color are different from each other.

16. The electroluminescence display of claim 15, wherein any one pixel representing a blue color among the first pixel, the second pixel, and the third pixel is larger than other two pixels.

17. The electroluminescence display of claim 1, wherein a first width of the depletion electrode at a minimum area where a distance between the first anode electrode and the second anode electrode has a minimum value is larger than a second width of the depletion electrode at other areas excepting the minimum area.

18. The electroluminescence display of claim 1, further comprising:

a bank covering edges of the first anode electrode and the second anode electrode, and whole of the depletion electrode.

19. The electroluminescence display of claim 1, further comprising:

a switching thin film transistor including a switching gate electrode, a switching semiconductor layer, a switching source electrode, and a switching drain electrode; and a driving thin film transistor including a driving gate electrode, a driving semiconductor layer, a driving source electrode, and a driving drain electrode, wherein the switching drain electrode is connected to the driving gate electrode.

20. The electroluminescence display of claim 1, further comprising;

a first color filter disposed at the first pixel on or under the emission layer; and a second color filter disposed at the second pixel on or under the emission layer, wherein the emission layer is commonly disposed on a whole surface on the substrate.

* * * * *